(12) United States Patent
Choi

(10) Patent No.: US 11,901,022 B2
(45) Date of Patent: Feb. 13, 2024

(54) NONVOLATILE MEMORY DEVICE PERFORMING INCREMENTAL STEP PULSE PROGRAM OPERATION AND OPERATING METHOD THEREOF

(71) Applicant: SK hynix Inc., Gyeonggi-do (KR)

(72) Inventor: Hyung Jin Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 201 days.

(21) Appl. No.: 17/583,884

(22) Filed: Jan. 25, 2022

(65) Prior Publication Data
US 2023/0084766 A1 Mar. 16, 2023

(30) Foreign Application Priority Data

Sep. 13, 2021 (KR) ........................ 10-2021-0121887

(51) Int. Cl.
| | | |
|---|---|---|
| *G11C 16/34* | (2006.01) |
| *G11C 16/10* | (2006.01) |
| *G11C 16/08* | (2006.01) |
| *G11C 16/30* | (2006.01) |
| *G11C 16/26* | (2006.01) |

(52) U.S. Cl.
CPC .......... *G11C 16/3459* (2013.01); *G11C 16/08* (2013.01); *G11C 16/102* (2013.01); *G11C 16/26* (2013.01); *G11C 16/30* (2013.01)

(58) Field of Classification Search
CPC ..................................................... G11C 16/08
See application file for complete search history.

(56) References Cited

U.S. PATENT DOCUMENTS

| 9,947,418 | B2 * | 4/2018 | Helm | .................. | G11C 11/5628 |
| 10,896,734 | B2 * | 1/2021 | Yang | .................. | G11C 16/0483 |
| 2006/0164890 | A1 * | 7/2006 | Lee | ......................... | G11C 16/12 |
| | | | | | 365/185.28 |
| 2008/0117684 | A1 * | 5/2008 | Hemink | .............. | G11C 11/5628 |
| | | | | | 365/185.19 |
| 2015/0078093 | A1 * | 3/2015 | Hahn | .................. | G11C 11/5628 |
| | | | | | 365/185.19 |

FOREIGN PATENT DOCUMENTS

KR 10-2012-0058157 A 6/2012

* cited by examiner

*Primary Examiner* — Douglas King
(74) *Attorney, Agent, or Firm* — IP & T GROUP LLP

(57) ABSTRACT

A nonvolatile memory device includes: a peripheral circuit for repeatedly performing program loops each including a program operation including a setup operation on the plurality of bit lines and an application operation of applying a program pulse to a selected word line and the verification operation, and a control logic circuit for controlling the peripheral circuit, wherein the peripheral circuit performs a first program loop of the program loops by: applying each a first and a second program pulses in each a first and a second section of the application operation, setting a first bit line to a first level and a second bit line to a second level lower than the first level from a start of the setup operation until an end of the first section, and resetting the first and the second bit line to the second level in the second section.

16 Claims, 11 Drawing Sheets

NONVOLATILE MEMORY DEVICE PERFORMING INCREMENTAL STEP PULSE PROGRAM OPERATION AND OPERATING METHOD THEREOF

CROSS-REFERENCE TO RELATED APPLICATION(S)

The present application claims priority under 35 U.S.C. § 119(a) to Korean Patent Application No. 10-2021-0121887, filed on Sep. 13, 2021, the disclosure of which is incorporated herein by reference in its entirety.

BACKGROUND

1. Field

Various embodiments of the present disclosure generally relate to a memory device, and more particularly, to a nonvolatile memory device performing program loops according to an incremental step pulse program (ISPP) scheme, and an operation method thereof.

2. Description of the Related Art

Memory systems are storage devices embodied using a semiconductor such as silicon (Si), germanium (Ge), gallium arsenide (GaAs), indium phosphide (InP), or the like. The memory systems are classified into a volatile memory device and a nonvolatile memory device. The volatile memory device is a memory device in which data stored therein is lost when the power supply is interrupted. Representative examples of the volatile memory device include static RAM (SRAM), dynamic RAM (DRAM), synchronous DRAM (SDRAM), etc. The nonvolatile memory device is a memory device in which data stored therein is retained even when the power supply is interrupted. Representative examples of the nonvolatile memory device include a read only memory (ROM), a programmable ROM (PROM), an electrically programmable ROM (EPROM), an electrically erasable programmable ROM (EEPROM), a flash memory, a phase-change random access memory (PRAM), a magnetic RAM (MRAM), a resistive RAM (RRAM), a ferroelectric RAM (FRAM), etc. Flash memories are chiefly classified into a NOR-type memory and NAND-type memory.

SUMMARY

Various embodiments of the present disclosure are directed to a nonvolatile memory device capable of improving program distribution of memory cells in an incremental step pulse program (ISPP) operation, and an operating method of the nonvolatile memory device.

In accordance with an embodiment of the present invention, a nonvolatile memory device may include: a plurality of memory cells coupled between a plurality of word lines and a plurality of bit lines; a peripheral circuit suitable for performing program loops each including a program operation and a verification operation, the program operation including a setup operation on the plurality of bit lines and an application operation of applying a program pulse to a selected word line and the verification operation including applying a verification voltage to the selected word line; and a control logic circuit suitable for controlling the peripheral circuit to repeatedly perform the program loops until programming for the selected word line is completed. The peripheral circuit may perform a first program loop of the program loops by: applying a first program pulse to the selected word line in a first section of the application operation, applying a second program pulse to the selected word line in a second section of the application operation, setting a first bit line group to a first voltage level and a second bit line group to a second voltage level lower than the first voltage level from a start of the setup operation until an end of the first section of the application operation, and resetting the first bit line group and the second bit line group to the second voltage level in the second section of the application operation.

In accordance with an embodiment of the present invention, an operating method of a nonvolatile memory device, the method may include: repeatedly performing, until programming for a selected word line is completed, program loops each including a program operation and a verification operation, the program operation including a setup operation on the plurality of bit lines and an application operation of applying a program pulse to the selected word line and the verification operation including applying a verification voltage to the selected word line. The repeatedly performing may include performing a first program loop of the program loops by: applying a first program pulse to the selected word line in a first section of the application operation, applying a second program pulse to the selected word line in a second section of the application operation, setting a first bit line group to a first voltage level and a second bit line group to a second voltage level lower than the first voltage level from a start of the setup operation until an end of the first section of the application operation, and resetting the first bit line group and the second bit line group to the second voltage level in the second section of the application operation.

The technical attributes obtainable from the present disclosure are not limited to those described herein, and other technical attributes not described herein will be understood by those skilled in the art, to which the present disclosure pertains, from the following description.

DETAILED DESCRIPTION

Figure 1:
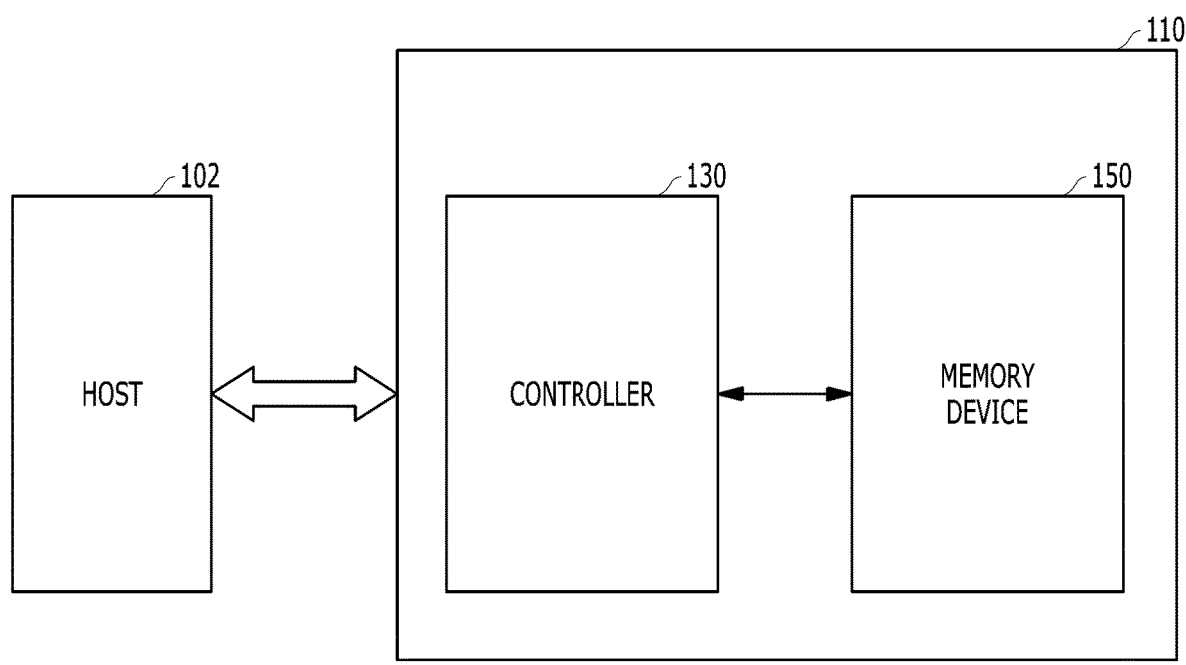
FIG. 1 is a diagram illustrating a memory system in accordance with an embodiment of the present disclosure.

Various embodiments of the present disclosure are described below with reference to the accompanying drawings. Elements and features of this disclosure, however, may be configured or arranged differently to form other embodiments, which may be variations of any of the disclosed embodiments.

In this disclosure, references to various features (e.g., elements, structures, modules, components, steps, operations, characteristics, etc.) included in "one embodiment," "example embodiment," "an embodiment," "another embodiment," "some embodiments," "various embodiments," "other embodiments," "alternative embodiment," and the like are intended to mean that any such features are included in one or more embodiments of the present disclosure, but may or may not necessarily be combined in the same embodiments.

In this disclosure, the terms "comprise," "comprising," "include," and "including" are open-ended. As used in the appended claims, these terms specify the presence of the stated elements and do not preclude the presence or addition of one or more other elements. The terms in a claim do not foreclose the apparatus from including additional components (e.g., an interface unit, circuitry, etc.).

In this disclosure, various units, circuits, or other components may be described or claimed as "configured to" perform a task or tasks. In such contexts, "configured to" is used to connote structure by indicating that the blocks/units/circuits/components include structure (e.g., circuitry) that performs one or more tasks during operation. As such, the block/unit/circuit/component can be said to be configured to perform the task even when the specified block/unit/circuit/component is not currently operational (e.g., is not turned on nor activated). The block/unit/circuit/component used with the "configured to" language includes hardware—for example, circuits, memory storing program instructions executable to implement the operation, etc. Additionally, "configured to" can include a generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that implement or perform one or more tasks.

As used in this disclosure, the term 'circuitry' or 'logic' refers to all of the following: (a) hardware-only circuit implementations (such as implementations in only analog and/or digital circuitry) and (b) combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions and (c) circuits, such as a microprocessor(s) or a portion of a microprocessor(s), that require software or firmware for operation, even if the software or firmware is not physically present. This definition of 'circuitry' or 'logic' applies to all uses of this term in this application, including in any claims. As a further example, as used in this application, the term "circuitry" or "logic" also covers an implementation of merely a processor (or multiple processors) or a portion of a processor and its (or their) accompanying software and/or firmware. The term "circuitry" or "logic" also covers, for example, and if applicable to a particular claim element, an integrated circuit for a storage device.

As used herein, the terms "first," "second," "third," and so on are used as labels for nouns that the terms precede, and do not imply any type of ordering (e.g., spatial, temporal, logical, etc.). The terms "first" and "second" do not necessarily imply that the first value must be written before the second value. Further, although the terms may be used herein to identify various elements, these elements are not limited by these terms. These terms are used to distinguish one element from another element that otherwise have the same or similar names. For example, a first circuitry may be distinguished from a second circuitry.

Further, the term "based on" is used to describe one or more factors that affect a determination. This term does not foreclose additional factors that may affect a determination. That is, a determination may be solely based on those factors or based, at least in part, on those factors. For example, the phrase "determine A based on B." While in this case, B is a factor that affects the determination of A, such a phrase does not foreclose the determination of A from also being based on C. In other instances, A may be determined based solely on B.

Herein, an item of data, a data item, a data entry or an entry of data may be a sequence of bits. For example, the data item may include the contents of a file, a portion of the file, a page in memory, an object in an object-oriented program, a digital message, a digital scanned image, a part of a video or audio signal, metadata or any other entity which can be represented by a sequence of bits. According to an embodiment, the data item may include a discrete object. According to another embodiment, the data item may include a unit of information within a transmission packet between two different components.

FIG. 1 is a diagram illustrating a memory system in accordance with an embodiment of the present disclosure.

Referring to FIG. 1, the data processing system 100 may include a host 102 engaged or operably coupled with the memory system 110.

The host 102 may include any of a portable electronic device, such as a mobile phone, an MP3 player, a laptop computer, or the like, and an electronic device, such as a desktop computer, a game player, a television (TV), a projector, or the like.

The host 102 also includes at least one operating system (OS), which can generally manage and control, functions and operations performed in the host 102. The OS can provide interoperability between the host 102 engaged with the memory system 110 and the user using the memory system 110. The OS may support functions and operations corresponding to a user's requests. By way of example but not limitation, the OS can be classified into a general operating system and a mobile operating system according to mobility of the host 102. The general operating system may be split into a personal operating system and an enterprise operating system according to system requirements or a user's environment. The personal operating system, including Windows and Chrome, may be subject to support services for general purposes. But the enterprise operating systems can be specialized for securing and supporting high performance, including Windows servers, Linux, Unix, and the like. Further, the mobile operating system may include Android, iOS, Windows mobile, and the like. The mobile operating system may be subject to support services or functions for mobility (e.g., a power saving function). The host 102 may include a plurality of operating systems. The host 102 may execute multiple operating systems interlocked with the memory system 110, corresponding to a user's request. The host 102 may transmit a plurality of commands corresponding to the user's requests into the memory system 110, thereby performing operations corresponding to commands within the memory system 110.

The memory system 110 operates in response to a request from the host 102, and, in particular, stores data to be accessed by the host 102. The memory system 110 may be used as a main memory device or an auxiliary memory device of the host 102. The memory system 110 may be implemented as any of various types of storage devices, depending on a host interface protocol which is coupled with the host 102. For example, the memory system 110 may be implemented as any of a solid state drive (SSD), a multimedia card (e.g., an MMC, an embedded MMC (eMMC), a reduced size MMC (RS-MMC) and a micro-MMC), a secure digital card (e.g., an SD, a mini-SD and a micro-SD), a universal serial bus (USB) storage device, a universal flash storage (UFS) device, a compact flash (CF) card, a smart media card, and a memory stick.

The memory system 110 may include a controller 130 and a memory device 150. The memory device 150 may store data to be accessed by the host 102. The controller 130 may control an operation of storing data in the memory device 150.

The controller 130 and the memory device 150 included in the memory system 110 may be integrated into a single semiconductor device, which may be included in any of the various types of memory systems as discussed above in the examples.

By way of example but not limitation, the controller 130 and memory device 150 may be implemented with an SSD. When the memory system 110 is used as an SSD, the operating speed of the host 102 connected to the memory system 110 can be improved more than that of the host 102 implemented with a hard disk. In addition, the controller 130 and the memory device 150 may be integrated into one semiconductor device to form a memory card, such as a PC card (PCMCIA), a compact flash card (CF), a memory card such as a smart media card (SM, SMC), a memory stick, a multimedia card (MMC, RS-MMC, MMCmicro), a SD card (SD, miniSD, microSD, SDHC), a universal flash memory, or the like.

The memory system 110 may be configured as a part of, for example, a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation system, a black box, a digital camera, a digital multimedia broadcasting (DMB) player, a 3-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, a radio frequency identification (RFID) device, or one of various components configuring a computing system.

The memory device 150 may be a nonvolatile memory device and may retain data stored therein even while electrical power is not supplied. The memory device 150 may store data provided by the host 102 through a write operation and provide data stored therein to the host 102 through a read operation.

The memory cell array may include a plurality of memory blocks. Each memory block may include a plurality of memory cells. One memory block may include a plurality of pages. In an embodiment, each page may be a unit by which data is stored in the memory device 150 or by which data stored in the memory device 150 is read.

A memory block may be a unit by which data is erased. In an embodiment, the memory device 150 may take many alternative forms, such as a double data rate synchronous dynamic random access memory (DDR SDRAM), a low power double data rate fourth generation (LPDDR4) SDRAM, a graphics double data rate (GDDR) SDRAM, a low power DDR (LPDDR) SDRAM, a Rambus dynamic random access memory (RDRAM), a NAND flash memory, a vertical NAND flash memory, a NOR flash memory device, a resistive RAM (RRAM), a phase-change memory (PRAM), a magnetoresistive RAM (MRAM), a ferroelectric RAM (FRAM), or a spin transfer torque RAM (SU-RAM). In the present specification, for convenience of description, a description will be made on that the memory device 150 is a NAND flash memory.

The memory device 150 may receive a command and an address from the controller 130, and may access the area of the memory cell array, selected by the address. That is, the memory device 150 may perform an operation indicated by the command on the area selected by the address. For example, the memory device 150 may perform a write operation (i.e., program operation), a read operation, and an erase operation. During a program operation, the memory device 150 may program data to the area selected by the address. During a read operation, the memory device 150 may read data from the area selected by the address. During an erase operation, the memory device 150 may erase data stored in the area selected by the address.

The controller 130 controls the overall operation of the memory system 110.

When power is applied to the memory system 110, the controller 130 may run firmware (FW). When the memory device 150 is a flash memory device, the controller 130 may run firmware such as a flash translation layer (FTL) for controlling communication between the host 102 and the memory device 150.

In an embodiment, the controller 130 may receive data and a logical block address (LBA) from the host 102, and may translate the logical block address into a physical block address (PBA) indicating the address of memory cells which are included in the memory device 150 and in which data is to be stored. In this specification, a logical block address (LBA) and a logical address may be used in the same sense. In this specification, a physical block address (PBA) and a physical address may be used in the same sense.

The controller 130 may control the memory device 150 so that a program operation, a read operation, or an erase operation is performed in response to a request received from the host 102. During a program operation, the controller 130 may provide a program command, a physical block address, and data to the memory device 150.

During a read operation, the controller 130 may provide a read command and a physical block address to the memory device 150. During an erase operation, the controller 130 may provide an erase command and a physical block address to the memory device 150.

In an embodiment, the controller 130 may autonomously generate a command, an address, and data regardless of a request from the host 102, and may transmit the command, the address, and the data to the memory device 150. For example, the controller 130 may provide commands, addresses, and data to the memory device 150 to perform background operations, such as a program operation for wear leveling and a program operation for garbage collection.

In an embodiment, the controller 130 may control two or more memory devices 100. In such a case, the controller 130 may control the memory devices 100 depending on an interleaving scheme to improve operating performance. The interleaving scheme may be an operating manner in which the operating periods of the at least two memory devices 100 are caused to overlap each other.

The host 102 may communicate with the memory system 110 using at least one of various communication standards or interfaces such as Universal Serial Bus (USB), Serial AT Attachment (SATA), Serial Attached SCSI (SAS), High Speed Interchip (HSIC), Small Computer System Interface (SCSI), Peripheral Component Interconnection (PCI), PCI express (PCIe), Nonvolatile Memory express (NVMe), Universal Flash Storage (UFS), Secure Digital (SD), MultiMedia Card (MMC), embedded MMC (eMMC), Dual In-line Memory Module (DIMM), Registered DIMM (RDIMM), and Load Reduced DIMM (LRDIMM) communication methods.

Figure 2:
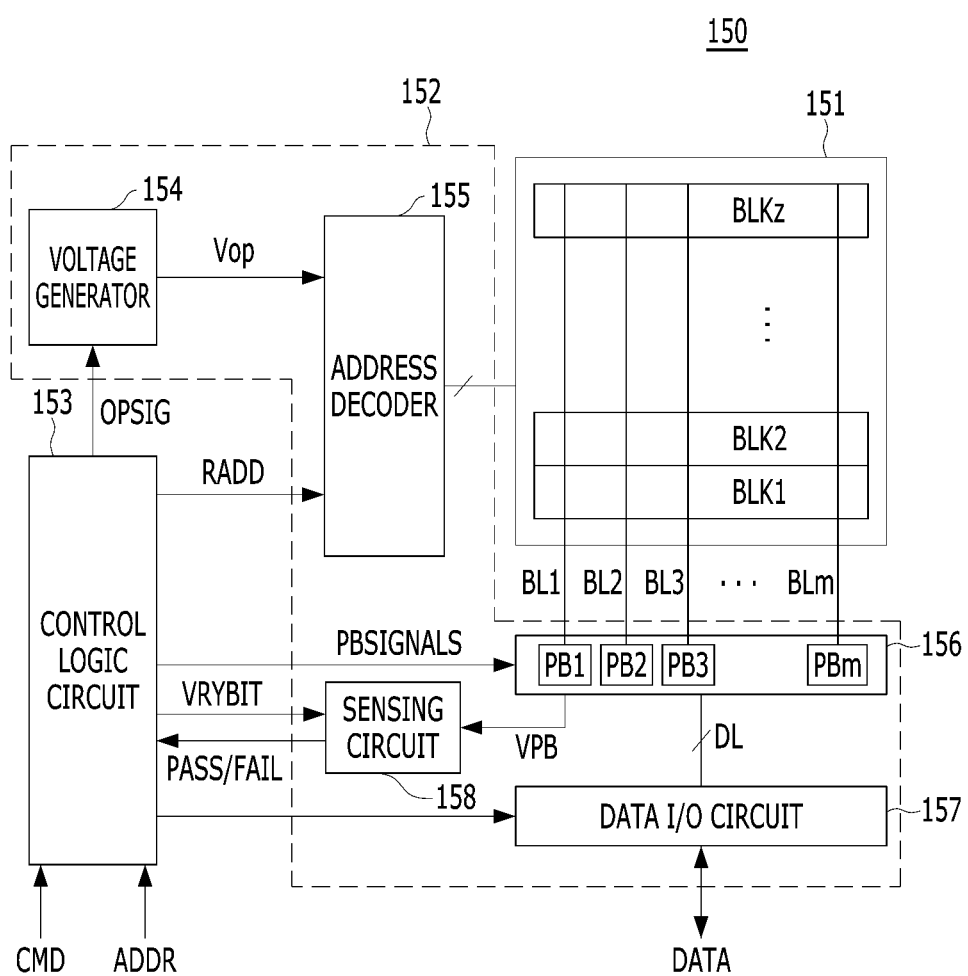
FIG. 2 is a detailed diagram illustrating a memory device illustrated in FIG. 1 in accordance with an embodiment of the present disclosure.

FIG. 2 is a detailed diagram illustrating a memory device illustrated in FIG. 1 in accordance with an embodiment of the present disclosure.

Referring to FIG. 2, the memory device 150 may include a memory cell array 151, a peripheral circuit 152 and a control logic circuit 153.

The memory cell array 151 may include a plurality of memory blocks BLK1 to BLKz. The plurality of memory blocks BLK1 to BLKz may be connected to an address decoder 155 through a row line RL. The plurality of memory blocks BLK1 to BLKz may be connected to a page buffer group 156 through bit lines BL1 to BLm. Each of the memory blocks BLK1 to BLKz may include a plurality of memory cells. In an embodiment, the plurality of memory cells may be nonvolatile memory cells. Memory cells connected to the same word line may be defined as one page. Accordingly, one memory block may include a plurality of pages.

The row line RL may include at least one source selection line, a plurality of word lines and at least one drain selection line.

The memory cells included in the memory cell array 151 may be configured as single level cells (SLCs) each storing 1-bit data, multi-level cells (MLCs) each storing 2-bit data, triple level cells (TLCs) each storing 3-bit data or quad level cells (QLCs) each storing 4-bit data.

The peripheral circuit 152 may be configured to perform a program, read or erase operation on a selected region of the memory cell array 151. The peripheral circuit 152 may drive the memory cell array 151. For example, the peripheral circuit 152 may apply various operating voltages to the row line RL and the bit lines BL1 to BLm, or discharge the applied voltages.

The peripheral circuit 152 may include the address decoder 155, a voltage generator 154, the page buffer group 156, a data input/output circuit 157 and a sensing circuit 158.

The peripheral circuit 152 may drive the memory cell array 151. For example, the peripheral circuit 152 may drive the memory cell array 151 to perform the program, read and erase operations.

The address decoder 155 may be connected to the memory cell array 151 through the row line RL. The row line RL may include the drain selection line, the word lines, the source selection line and a common source line.

The address decoder 155 may be configured to operate in response to the control of the control logic circuit 153. The address decoder 155 may receive an address RADD from the control logic circuit 153.

The address decoder 155 may be configured to decode a block address of the received address RADD. The address decoder 155 may select at least one memory block among the memory blocks BLK1 to BLKz according to the decoded block address. The address decoder 155 may be configured to decode a row address of the received address RADD. The address decoder 155 may select at least one word line among word lines of the selected memory block according to the decoded row address. The address decoder 155 may apply operating voltages Vop, which are supplied from the voltage generator 154, to the selected word line.

During the program operation, the address decoder 155 may apply a program voltage to the selected word line, and apply a pass voltage having a lower level than the program voltage to an unselected word line. During a program verification operation, the address decoder 155 may apply a verification voltage to the selected word line, and apply a verification pass voltage having a higher level than the verification voltage to the unselected word line.

During the read operation, the address decoder 155 may apply a read voltage to the selected word line, and apply a read pass voltage having a higher level than the read voltage to the unselected word line.

The erase operation of the memory device 150 may be performed in units of memory blocks. An address ADDR inputted to the memory device 150 during the erase operation may include a block address. The address decoder 155 may decode the block address, and select at least one memory block according to the decoded block address. During the erase operation, the address decoder 155 may apply a ground voltage to a word line of the selected memory block.

The voltage generator 154 may be configured to generate a plurality of operating voltages Vop by using an external power supply voltage supplied to the memory device 150. The voltage generator 154 may operate in response to the control of the control logic circuit 153.

In an embodiment, the voltage generator 154 may regulate the external power supply voltage, and generate an internal power supply voltage. The internal power supply voltage generated by the voltage generator 154 may be used as an operating voltage of the memory device 150.

In an embodiment, the voltage generator 154 may generate the plurality of operating voltages Vop by using the external power supply voltage or the internal power supply voltage. The voltage generator 154 may be configured to generate various voltages required by the memory device 150. For example, the voltage generator 154 may generate a plurality of erase voltages, a plurality of program voltages, a plurality of pass voltages, a plurality of selective read voltages and a plurality of unselective read voltages.

The voltage generator 154 may include a plurality of pumping capacitors, which receive the internal power supply voltage, to generate the plurality of operating voltages Vop having various voltage levels, and generate the plurality of operating voltages Vop by selectively activating the plurality of pumping capacitors in response to the control of the control logic circuit 153.

The generated operating voltages Vop may be supplied to the memory cell array 151 by the address decoder 155.

The page buffer group 156 may include a plurality of page buffers PB1 to PBm. The plurality of page buffers PB1 to PBm may be connected to the memory cell array 151 through the plurality of bit lines BL1 to BLm, respectively. The plurality of page buffers PB1 to PBm may operate in response to the control of the control logic circuit 153.

The plurality of page buffers PB1 to PBm may communicate data DATA with the data input/output circuit 157. During the program operation, the plurality of page buffers PB1 to PBm may receive the data DATA to be stored, through the data input/output circuit 157 and a data line DL.

During the program operation, the plurality of page buffers PB1 to PBm may transmit the data DATA, which is received through the data input/output circuit 157, to the selected memory cell through the bit lines BL1 to BLm when the program voltage is applied to the selected word line. Memory cells of a selected page may be programmed according to the transmitted data DATA. A memory cell connected to a bit line to which a program allowable voltage, for example, a ground voltage, is applied may have a raised threshold voltage. A threshold voltage of a memory cell connected to a bit line to which a program inhibited voltage, for example, a power supply voltage, is applied may be maintained. During the program verification operation, the plurality of page buffers PB1 to PBm may read the data DATA, which is stored in the memory cell, from the selected memory cell through the bit lines BL1 to BLm.

During the read operation, the page buffer group 156 may read the data DATA from the memory cell of the selected page through the bit lines BLs, and store the read data DATA in the plurality of page buffers PB1 to PBm.

During the erase operation, the page buffer group 156 may float the bit lines BLs. In an embodiment, the page buffer group 156 may include a column selection circuit.

The data input/output circuit 157 may be connected to the plurality of page buffers PB1 to PBm through the data line DL. The data input/output circuit 157 may operate in response to the control of the control logic circuit 153.

The data input/output circuit 157 may include a plurality of input/output buffers (not illustrated) that receive the data DATA inputted thereto. During the program operation, the data input/output circuit 157 may receive the data DATA to be stored from the controller 130 (refer to FIG. 1). The data input/output circuit 157 may output the data DATA, which is transmitted from the plurality of page buffers PB1 to PBm included in the page buffer group 156, to the controller 130 (refer to FIG. 1) during the read operation.

During the read operation or the verification operation, the sensing circuit 158 may generate a reference current in response to an allowable bit VRYBIT generated by the control logic circuit 153, and output a pass signal PASS or a fail signal FAIL to the control logic circuit 153 by comparing a sensing voltage VPB received from the page buffer group 156 with a reference voltage attributable to the reference current.

The control logic circuit 153 may be connected to the address decoder 155, the voltage generator 154, the page buffer group 156, the data input/output circuit 157 and the sensing circuit 158. The control logic circuit 153 may be configured to control overall operations of the memory device 150. The control logic circuit 153 may operate in response to a command CMD transmitted from an external device.

The control logic circuit 153 may generate various signals in response to the command CMD and the address ADDR, and control the other components 154 to 158 included in the peripheral circuit 152. For example, the control logic circuit 153 may generate an operation signal OPSIG, the address RADD, read and write circuit control signals PBSIGNALS and the allowable bit VRYBIT in response to the command CMD and the address ADDR. The control logic circuit 153 may output the operation signal OPSIG to the voltage generator 154, output the address RADD to the address decoder 155, output the read and write control signals PBSIGNALS to the page buffer group 156, and output the allowable bit VRYBIT to the sensing circuit 158. In addition, the control logic circuit 153 may determine whether the verification operation has passed or failed, in response to the pass or fail signal PASS or FAIL outputted by the sensing circuit 158.

Figure 3:
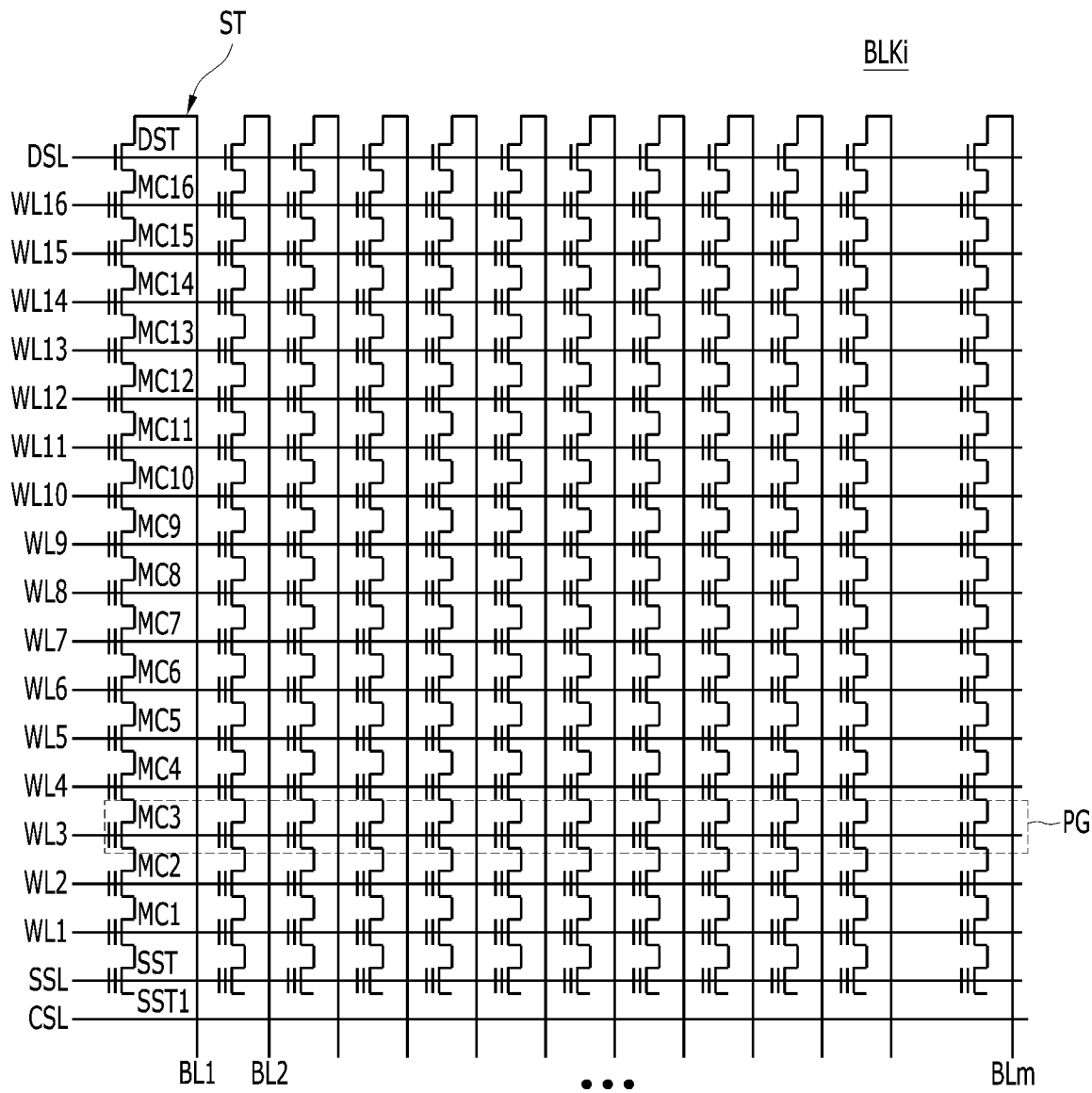
FIG. 3 is a detailed diagram illustrating a memory block illustrated in FIG. 2 in accordance with an embodiment of the present disclosure.
Figure 3:
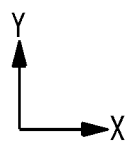

FIG. 3 is a detailed diagram illustrating a memory block illustrated in FIG. 2 in accordance with an embodiment of the present disclosure.

Referring to FIG. 3, a plurality of word lines arranged in parallel with one another may be connected between a first selection line and a second selection line. The first selection line may be a source selection line SSL, and the second selection line may be a drain selection line DSL. More specifically, a memory block BLKi may include a plurality of memory cell strings ST connected between the bit lines BL1 to BLm and a common source line CSL. The bit lines BL1 to BLm may be connected to the memory cell strings ST, respectively, and the common source line CSL may be connected to the memory cell strings ST in common. Since the memory cell strings ST may have the same configuration, the memory cell string ST connected to the first bit line BL1 is representatively described in detail.

The memory cell string ST may include a source selection transistor SST, a plurality of memory cells MC1 to MC16 and a drain selection transistor DST connected in series between the common source line CSL and the first bit line BL1. At least one drain selection transistor DST may be included in one memory cell string ST, and more source selection transistors SST and memory cells MC1 to MC16 may be included than illustrated in the drawing.

A source of the source selection transistor SST may be connected to the common source line CSL, and a drain of the drain selection transistor DST may be connected to the first bit line BL1. The memory cells MC1 to MC16 may be connected in series between the source selection transistor SST and the drain selection transistor DST. Gates of the source selection transistors SST included in different memory cell strings ST may be connected to the source selection line SSL, gates of the drain selection transistors DST included in different memory cell strings ST may be connected to the drain selection line DSL, and gates of the memory cells MC1 to MC16 may be connected to a plurality of word lines WL1 to WL16, respectively. A group of memory cells connected to the same word line among memory cells included in different memory cell strings ST may be referred to as a physical page PG. Accordingly, as many physical pages PG as the number of word lines WL1 to WL16 may be included in the memory block BLKi.

One memory cell may store 1-bit data. This is commonly referred to as a single level cell (SLC). In this case, one physical page PG may store one logical page (LPG) data. One logical page (LPG) data may include as many data bits as the number of cells included in one physical page PG.

One memory cell may store two or more bits of data. In this case, one physical page PG may store two or more logical page (LPG) data.

Figure 4:
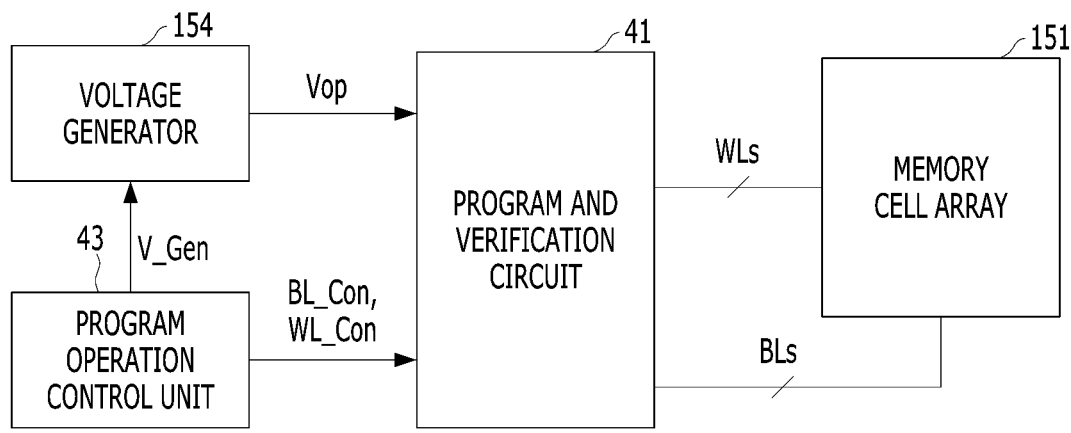
FIG. 4 is a detailed diagram illustrating the memory device illustrated in FIG. 2 in accordance with an embodiment of the present disclosure.

FIG. 4 is a detailed diagram illustrating the memory device illustrated in FIG. 2 in accordance with an embodiment of the present disclosure.

Referring to FIG. 4, the memory device 150 may include a memory cell array 151, a program and verification circuit 41, a voltage generator 154 and a program operation control unit 43.

The peripheral circuit 152 described with reference to FIG. 2 may include the program and verification circuit 41 and the voltage generator 154. The program and verification circuit 41 may include the address decoder 155, the sensing circuit 158, the page buffer group 156 and the data input/output circuit 157 which are illustrated in FIG. 2. The control logic circuit 153 described with reference to FIG. 2 may include the program operation control unit 43. That is, an operation of the program and verification circuit 41, which is to be described below, may be an operation of the peripheral circuit 152, and an operation of the program operation control unit 43 may be an operation of the control logic circuit 153.

The memory cell array 151 may include a plurality of memory cells. The memory cell array 151 may be connected to the program and verification circuit 41 through a plurality of word lines WLs connected to the plurality of memory cells. The memory cell array 151 may be connected to the program and verification circuit 41 through a plurality of bit lines BLs connected to the plurality of memory cells. The plurality of word lines WLs and the plurality of bit lines BLs may be cross-connected as described in FIG. 3.

The voltage generator 154 may generate the operating voltages Vop, which are required for operations on the memory cells, in response to a voltage generation signal V_Gen. Among the operating voltages Vop, a voltage applied to a word line may be a word line voltage. The voltage generator 154 may provide the program and verification circuit 41 with the generated operating voltages Vop.

The program and verification circuit 41 may receive the operating voltages Vop from the voltage generator 154. The program and verification circuit 41 may perform a program operation including a setup operation for the plurality of bit lines BLs and an application operation for applying a program pulse (hereinafter referred to as a "program pulse application operation") to a word line selected as a program target (hereinafter referred to as a "program target word line") among the plurality of word lines WLs. The program and verification circuit 41 may perform a verification operation of applying a verification voltage to the program target word line among the plurality of word lines WLs. The program and verification circuit 41 may perform one or more program loops each including the program operation and the verification operation.

The program operation control unit 43 may control an operation of the program and verification circuit 41 to repeatedly perform at least one program loop until programming for the program target word line among the plurality of word lines WLs is completed.

The program operation control unit 43 may control the operation of the program and verification circuit 41 to apply a first program pulse to the program target word line in a first section of the program pulse application operation of the program operation included in a first program loop. The program operation control unit 43 may control the operation of the program and verification circuit 41 to apply a second program pulse to the program target word line in a second section of the program pulse application operation of the program operation included in the first program loop. The program operation control unit 43 may control the operation of the program and verification circuit 41 to set a first bit line group of the plurality of bit lines BLs to a first voltage level and a second bit line group to a second voltage level lower than the first voltage level at a start of a bit line setup operation of the program operation included in the first program loop and maintain the levels until an end of the first section of the program pulse application operation of the program operation included in the first program loop. That is, the program operation control unit 43 may control the operation of the program and verification circuit 41 to set the first bit line group of the plurality of bit lines BLs to the first voltage level and the second bit line group to the second voltage level lower than the first voltage level from a start time point of the bit line setup operation of the program operation until the end of the first section of the program pulse application operation within the first program loop. The program operation control unit 43 may control the operation of the program and verification circuit 41 to reset the first and second bit line groups of the plurality of bit lines BLs to the second voltage level in a second section of the program pulse application operation of the program operation included in the first program loop.

The program operation control unit 43 may control the operation of the program and verification circuit 41 to apply a third program pulse to the program target word line in an increment step pulse program (ISPP) method in the program operation included in the subsequent program loops that can be repeated after the first program loop.

Figure 5:
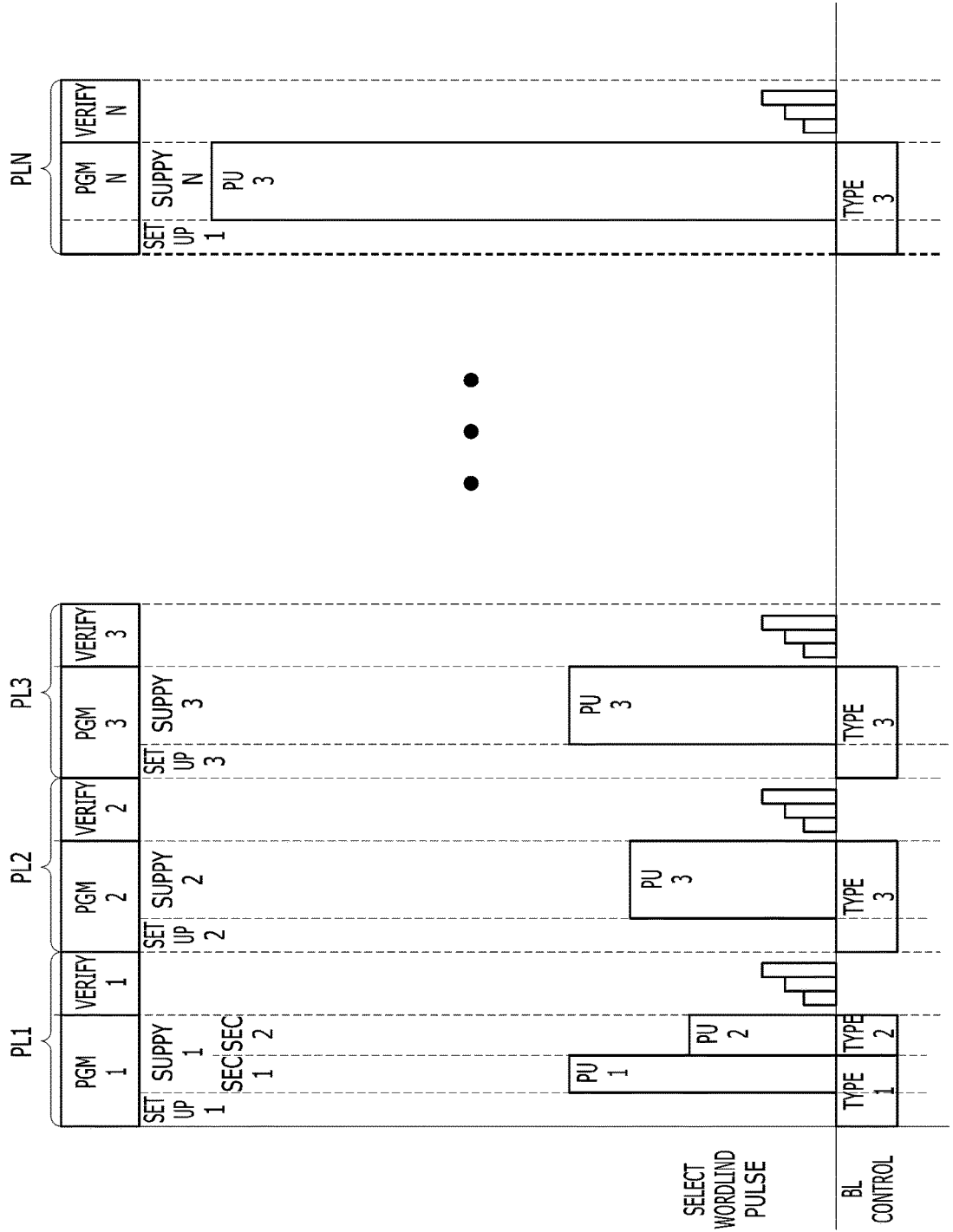
FIGS. 5 and 6 are diagrams illustrating a program operation in accordance with a first embodiment of the present disclosure.
Figure 6:
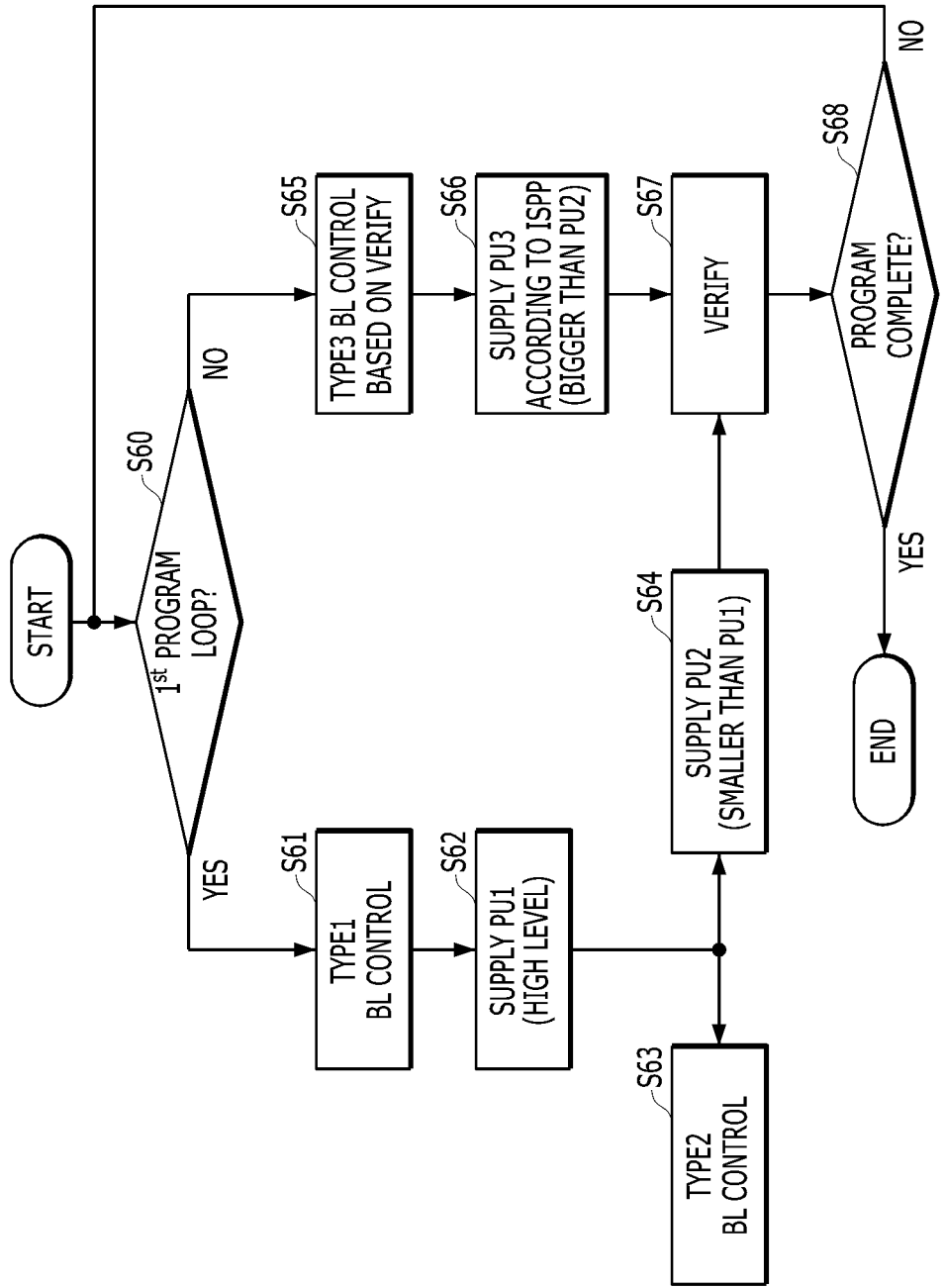

FIGS. 5 and 6 are diagrams illustrating a program operation in accordance with a first embodiment of the present disclosure.

Referring to FIGS. 4 and 5, the program operation control unit 43 may control the operation of the program and verification circuit 41 to repeatedly perform N program loops PL1, PL2, PL3 to PLN, where N is a natural number equal to or greater than 2, until the programming for the program target word line among the plurality of word lines WLs is completed.

Specifically, the N program loops PL1, PL2, PL3 to PLN may include respective program operations PGM1, PGM2, PGM3 to PGMN and respective verification operations VERIFY1, VERIFY2, VERIFY3 to VERIFYN. The program operations PGM1, PGM2, PGM3 to PGMN included in the N program loops PL1, PL2, PL3 to PLN, respectively, may include respective bit line setup operations SET UP1, SET UP2, SET UP3 to SET UPN and respective program pulse application operations SUPPLY1, SUPPLY2, SUPPLY3 to SUPPLYN.

Each of the program operations PGM1, PGM2, PGM3 to PGMN included in the N program loops PL1, PL2, PL3 to PLN, respectively, may be an operation of raising threshold voltages of memory cells selected as the program target (hereinafter referred to as "program target memory cells") to target threshold voltages corresponding to target program states, depending on data to be stored in the program target memory cells connected to the program target word line. According to an embodiment, referring to FIG. 11 in which the memory cells are triple-level cells (TLC), the threshold voltages of the program target memory cells may be targeted at a total of eight types of program states E, P1, P2, P3, P4, P5, P6 and P7, depending on the data stored in the program target memory cells. All program target memory cells are in an erase state E before the program loops PL1, PL2, PL3 to PLN start, and the program loops PL1, PL2, PL3 to PLN may be repeated until each of the program target memory cells reaches a target program state. For example, in the case of a memory cell targeting the program state P7, the threshold voltage level thereof has to increase relatively significantly, and thus the number of repetitions of the program loops PL1, PL2, PL3 to PLN may be relatively large. On the other hand, in the case of a memory cell targeting the program state P1, the threshold voltage level thereof may increase relatively slightly, and thus the number of repetitions of the program loops PL1, PL2, PL3 to PLN may be relatively small.

Each of the verification operations VERIFY1, VERIFY2, VERIFY3 to VERIFYN included in the N program loops PL1, PL2, PL3 to PLN, respectively, may be an operation of verifying whether the program operations PGM1, PGM2, PGM3 to PGMN are properly performed on the program target memory cells. That is, each of the verification operations VERIFY1, VERIFY2, VERIFY3 to VERIFYN may be an operation of checking whether the threshold voltages of the memory cells on which the program operation PGM1, PGM2, PGM3 to PGMN has been performed reach the target threshold voltages corresponding to the target program states of the program operations. According to an embodiment, referring to FIG. 11 in which the memory cells are triple-level cells (TLC), the program loops need to be further repeated when it is checked through the verification operation that a threshold voltage level of a memory cell targeting the program state P4 is in the program state P1, P2 or P3, but the program loops may not be repeated when it is checked through the verification operation that the threshold voltage level of the memory cell targeting the program state P4 is in the program state P4.

In an embodiment, the first program loop PL1 may be performed in a different way from subsequent program loops PL2, PL3 to PLN among the N program loops PL1, PL2, PL3 to PLN. In the present disclosure, the first program loop PL1 is the initial one of the program loops PL1, PL2, PL3 to PLN that are repeatedly performed until programming for the program target word line among the plurality of word lines WLs is completed.

That is, in an embodiment, the program pulse application operation SUPPLY1 included in the program operation PGM1 included in the first program loop PL1 among the N program loops PL1, PL2, PL3 to PLN may be divided into a first section SEC1 and a second section SEC2. In this disclosure, the first and second sections SEC1 and SEC2 of the program pulse application operation within the first program loop PL1 are first and second halves of the program pulse application operation. The first and second halves may have the same time-length as each other or different time-lengths from each other. On the other hand, the program pulse application operations SUPPLY2, SUPPLY3 to SUPPLYN included in the program operations PGM2, PGM3 to PGMN included in the subsequent program loops PL2, PL3 to PLN, respectively, among the N program loops PL1, PL2, PL3 to PLN may each have only one section.

The program operation control unit 43 may control the operation of the program and verification circuit 41 to apply a first program pulse PU1 to the program target word line in the first section SEC1 of the program pulse application operation SUPPLY1 of the program operation PGM1 included in the first program loop PL1. The program operation control unit 43 may control the operation of the program and verification circuit 41 to apply a second program pulse PU2 to the program target word line in the second section SEC2 of the program pulse application operation SUPPLY1 of the program operation PGM1 included in the first program loop PL1.

The program operation control unit 43 may control the operation of the program and verification circuit 41 to apply third program pulses PU3 to the program target word line in the ISPP method in the program operations PGM2, PGM3 to PGMN included in the subsequent program loops PL2, PL3 to PLN, respectively, which are repeated after the first program loop PL1. Voltage levels of the third program pulses PU3 may increase according to the ISPP method as the program loops PL2, PL3 to PLN are repeated as illustrated in the drawing.

The program operation control unit 43 may control the operation of the program and verification circuit 41 to set a voltage level of the second program pulse PU2 to be lower than a voltage level of the first program pulse PU1.

The program operation control unit 43 may control the operation of the program and verification circuit 41 to set the voltage levels of the third program pulses PU3 to be higher than the voltage level of the second program pulse PU2. According to an embodiment, a voltage level of the smallest pulse among the third program pulses PU3 whose voltage levels increase according to the repetition of the program loops PL2, PL3 to PLN may also be set to be higher than the voltage level of the second program pulse PU2.

The program operation control unit 43 may control the operation of the program and verification circuit 41 to set a voltage level of at least one pulse of the third program pulses PU3 to be lower than the voltage level of the first program pulse PU1. According to an embodiment, a voltage level of the third program pulse PU3 corresponding to the second program loop PL2 may be set to be lower than the voltage level of the first program pulse PU1, and a voltage level of the third program pulse PU3 corresponding to the third program loop PL3 may be set to be the same as the voltage level of the first program pulse PU1.

The program operation control unit 43 may control the operation of the program and verification circuit 41 to set voltage levels of the plurality of bit lines BLs to a first type TYPE1 at the start of a bit line setup operation SET UP1 of the program operation PGM1 included in the first program loop PL1 and maintain the voltage levels until the end of the first section SEC1 of the program pulse application operation SUPPLY1 of the program operation PGM1 included in the first program loop PL1. The program operation control unit 43 may control the operation of the program and verification circuit 41 to set the voltage levels of the plurality of bit lines BLs to the first type TYPE1 from a start time point of the bit line setup operation SET UP1 of the program operation PGM1 included in the first program loop PL1 until the end of the first section SEC1 of the program pulse application operation SUPPLY1 of the program operation PGM1.

The program operation control unit 43 may control the operation of the program and verification circuit 41 to reset the voltage levels of the plurality of bit lines BLs to a second type TYPE2 in the second section SEC2 of the program pulse application operation SUPPLY1 of the program operation PGM1 included in the first program loop PL1.

The program operation control unit 43 may control the operation of the program and verification circuit 41 to set the voltage levels of the plurality of bit lines BLs to a third type TYPE3 in bit line setup operations SET UP2, SET UP3 to SET UPN of the program operations PGM2, PGM3 to PGMN included in the subsequent program loops PL2, PL3 to PLN and maintain the voltage levels until the program pulse application operations SUPPLY2, SUPPLY3 to SUPPLYN of the program operations PGM2, PGM3 to PGMN included in the subsequent program loops PL2, PL3 to PLN. The program operation control unit 43 may control the operation of the program and verification circuit 41 to set the voltage levels of the plurality of bit lines BLs to the third type TYPE3 from start time points of the bit line setup operations SET UP2, SET UP3 to SET UPN of the program operations PGM2, PGM3 to PGMN included in the subsequent program loops PL2, PL3 to PLN until the program pulse application operations SUPPLY2, SUPPLY3 to SUPPLYN.

When the bit lines BLs are set to the first type TYPE1, the first bit line group of the plurality of bit lines BLs may be set to the first voltage level and the second bit line group of the plurality of bit lines BLs may be set to the second voltage level lower than the first voltage level.

When the bit lines BLs are set to the second type TYPE2, the first and second bit line groups of the plurality of bit lines BLs may be set to the second voltage level.

According to an embodiment, the first and second bit line groups may refer to bit lines connected to the program target memory cells among the plurality of bit lines BLs. The first bit line group may refer to bit lines connected to memory cells being targeted at having a first threshold voltage level among the program target memory cells. The second bit line group may refer to bit lines connected to memory cells being targeted at having a second threshold voltage level among the program target memory cells. According to an embodiment, referring to FIG. 11 in which the memory cells are triple-level cells (TLC), bit lines connected to memory cells being targeted at having the threshold voltage levels included in the program state P1 may be classified as the first bit line group, and bit lines connected to memory cells being targeted at having the threshold voltage levels included in the program states P2 to P7 may be classified as the second bit line group. According to another embodiment, when the memory cells are triple-level cells (TLC), bit lines connected to memory cells being targeted at having the threshold voltage levels included in the program states P1 to P3 may be classified as the first bit line group, and bit lines connected to memory cells being targeted at having the threshold voltage levels included in the program states P4 to P7 may be classified as the second bit line group.

According to an embodiment, the first voltage level may refer to a power source voltage VCORE level, and the second voltage level may refer to a ground voltage VSS level.

When the bit lines BLs are set to the third type TYPE3, the voltage levels of the plurality of bit lines BLs may be set according to whether an additional program loop is required as a result of the verification operations VERIFY1, VERIFY2, VERIFY3 to VERIFYN−1. When the bit lines BLs are set to the third type TYPE3, bit lines connected to memory cells, on which the program loops need to be further repeated, may be set to a program allowing level and bit lines connected to memory cells, on which the program loops do not need to be further repeated, may be set to a program prohibiting level. The program allowing level may be the level of the ground voltage VSS and the program prohibiting level may be the level of the power source voltage VCORE.

Figure 11:
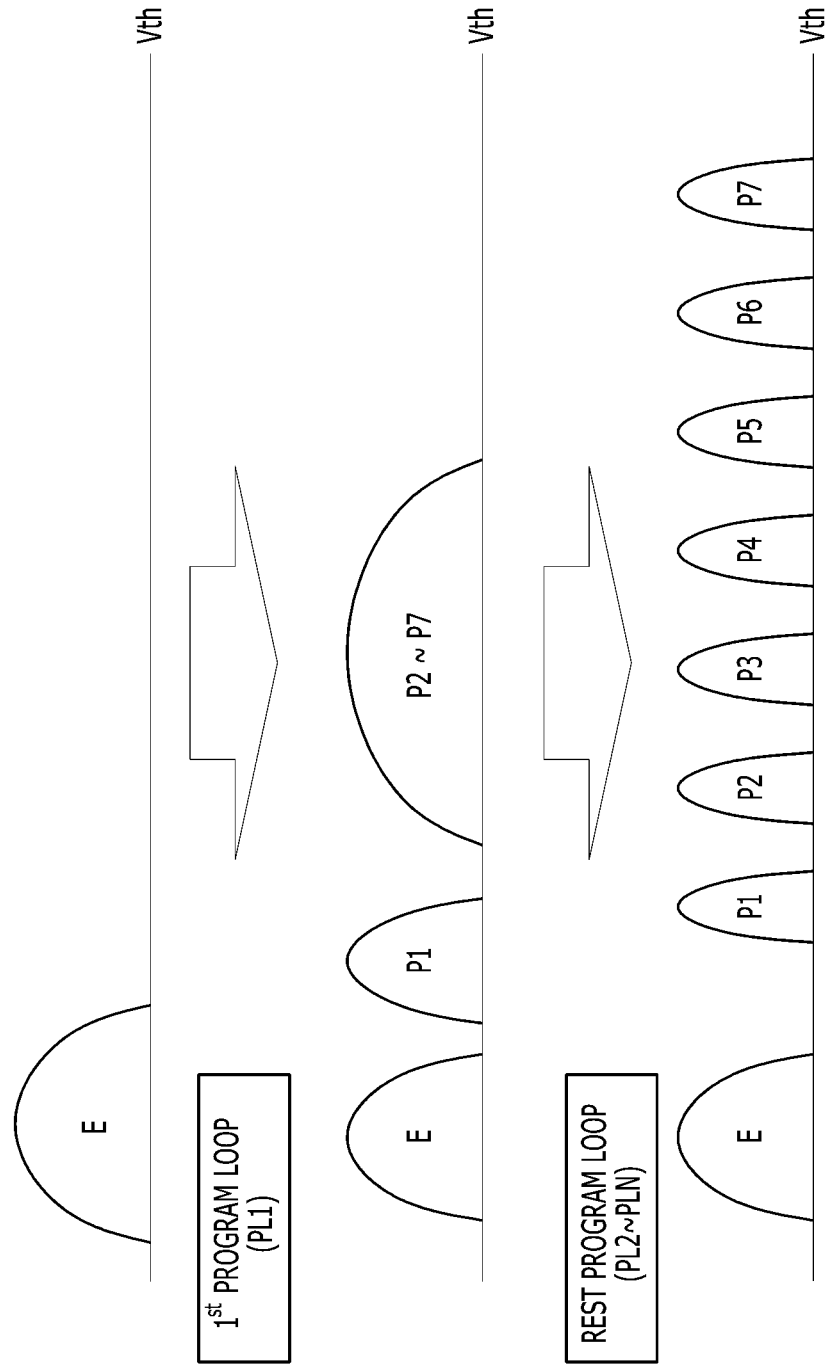
FIG. 11 is a diagram illustrating a change in a program state of a memory cell in a program operation in accordance with an embodiment of the present disclosure.

As described above, in an embodiment, the first program loop PL1 may be performed in different way from subsequent program loops PL2, PL3 to PLN among the N program loops PL1, PL2, PL3 to PLN and consequently, the program states of the memory cells may be classified as disclosed in FIG. 11.

Referring to FIG. 11, as a result of performing the first program loop PL1, the width of increase in the threshold voltage levels of the memory cells being targeted to the program state P1 may be relatively smaller than the width of increase in the threshold voltage levels of the memory cells being targeted to the program states P2 to P7. Accordingly, as the result of performing the first program loop PL1, the program states of the memory cells may be two tentative states, as illustrated in FIG. 11.

In this way, as the first program loop PL1 is performed, and then the subsequent program loops PL2, PL3 to PLN are repeated, each of the program target memory cells may have a target threshold voltage level.

Referring to FIG. 6, it may be seen in what order the program operations according to the first embodiment described with reference to FIGS. 4 and 5 are performed.

When the programming starts, it may be checked whether a current program loop is the first program loop PL1 of the program loops PL1, PL2, PL3 to PLN that are repeatedly performed until programming for the program target word line among the plurality of word lines WLs is completed, in operation S60.

When a check result indicates that the current program loop is the first program loop PL1 (that is, "YES" in operation S60), the plurality of bit lines BLs may be set to the first type TYPE1 in the bit line setup operation SET UP1 of the program operation PGM1, in operation S61. That is, the first bit line group of the plurality of bit lines BLs may be set to the first voltage level, and the second bit line group may be set to the second voltage level lower than the first voltage level.

In operation S62 subsequent to operation S61, the first program pulse PU1 may be applied to the program target word line in the first section SEC1 included in the program pulse application operation SUPPLY1 of the program operation PGM1.

After operation S62, in the second section SEC2 included in the program pulse application operation SUPPLY1 of the program operation PGM1, the operation of setting the plurality of bit lines BLs to the second type TYPE2 in operation S63 and the operation of applying the second program pulse PU2 to the program target word line in operation S64 may be simultaneously performed. In this case, the second program pulse PU2 may have a lower voltage level than the first program pulse PU1. That is, the second program pulse PU2 may have a lower voltage level than the first program pulse PU1 (SMALLER THAN PU1).

In operation S67 subsequent to operations S63 and S64, the verification operation VERIFY1 may be performed.

When the check result indicates that the current program loop is not the first program loop PL1 (that is, "NO" in operation S60), that is, the current program loop is the subsequent program loops PL2, PL3 to PLN, the plurality of bit lines BLs may be set to the third type TYPE3 in the bit line setup operations SET UP2, SET UP3 to SET UPN of the program operations PGM2, PGM3 to PGMN, in operation S65. That is, the voltage level of each of the plurality of bit lines BLs may be set according to whether an additional program loop is required as a result of the verification operations VERIFY1, VERIFY2, VERIFY3 to VERIFYN−1.

In operation S66 subsequent to operation S65, the third program pulses PU3 may be applied to the program target word line in the ISPP method in the program pulse application operations SUPPLY2, SUPPLY3 to SUPPLYN of the program operations PGM2, PGM3 to PGMN. In this case, the voltage levels of the third program pulses PU3 may increase according to the ISPP method as the program loops PL2, PL3 to PLN are repeated. Also, the voltage levels of the third program pulses PU3 may be higher than the voltage level of the second program pulse PU2 (BIGGER THAN PU2). At least one of the third program pulses PU3 may have a lower voltage level than the first program pulse PU1.

In operation S67 subsequent to operation S66, the verification operation VERIFY1 may be performed.

In operation S68 subsequent to operation S67, it may be checked whether the programming is completed.

When the programming is completed (that is, "YES" in operation S68), the programming may terminate.

When the programming is not completed (that is, "NO" in operation S68), the program loops may be repeated.

Figure 7:
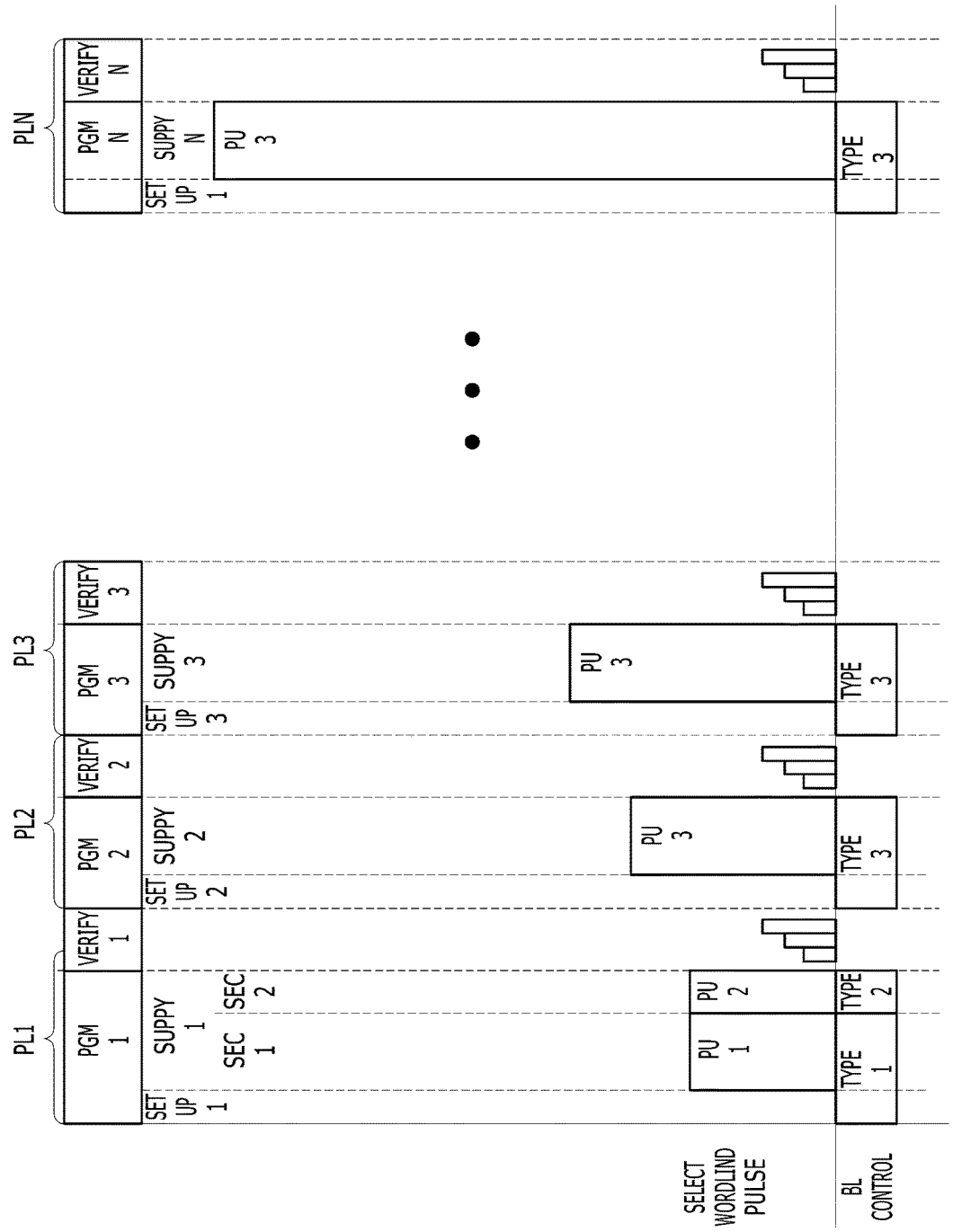
FIGS. 7 and 8 are diagrams illustrating a program operation in accordance with a second embodiment of the present disclosure.
Figure 8:
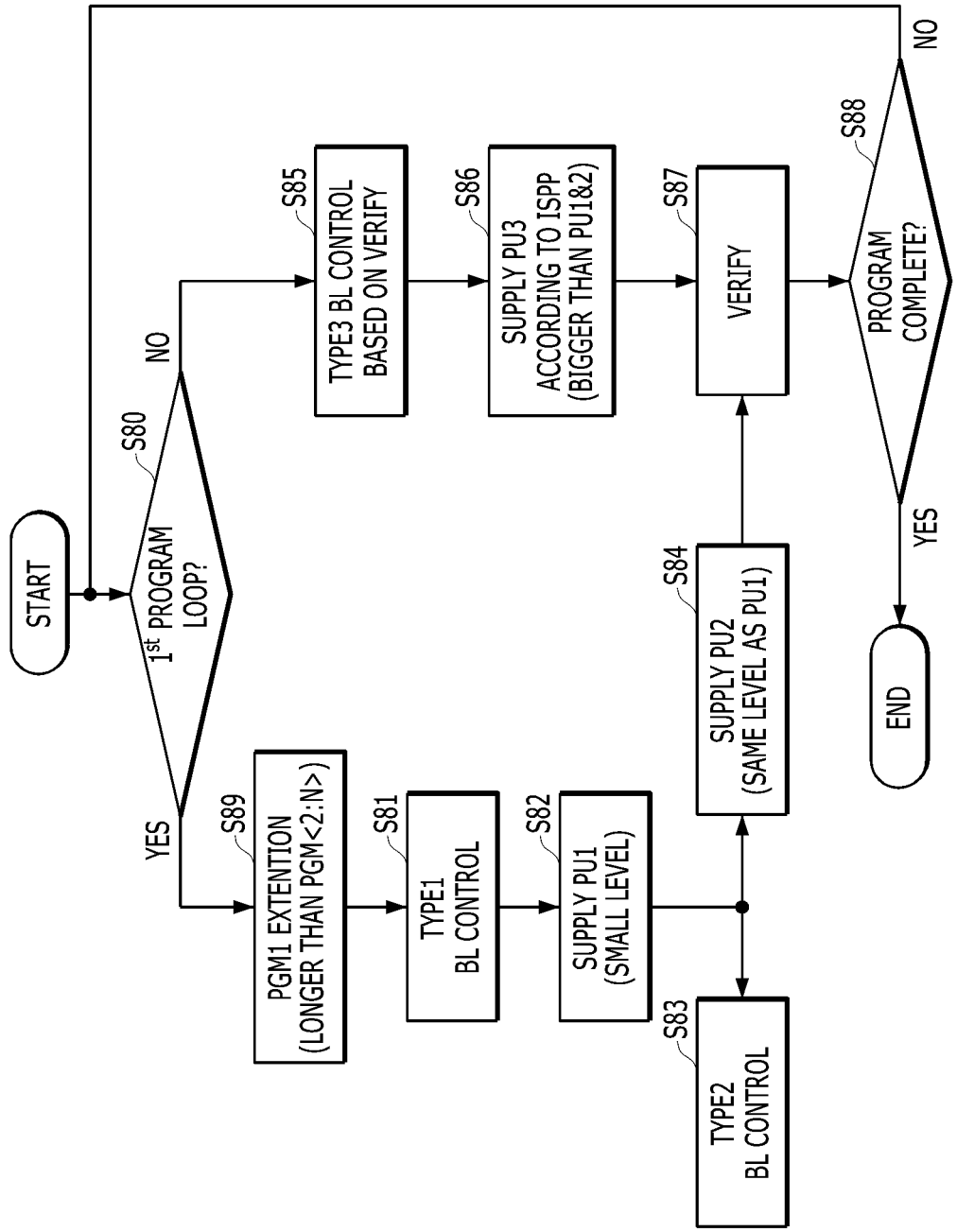

FIGS. 7 and 8 are diagrams illustrating a program operation in accordance with a second embodiment of the present disclosure.

Referring to FIGS. 4 and 7, even in the program operation according to the second embodiment as the program operation described in the first embodiment of FIGS. 5 and 6, the first program loop PL1 may be performed in a different way from subsequent program loops PL2, PL3 to PLN among the N program loops PL1, PL2, PL3 to PLN.

That is, in an embodiment, the program pulse application operation SUPPLY1 included in the program operation PGM1 included in the first program loop PL1 among the N program loops PL1, PL2, PL3 to PLN may be divided into a first section SEC1 and a second section SEC2. On the other hand, the program pulse application operations SUPPLY2, SUPPLY3 to SUPPLYN included in the program operations PGM2, PGM3 to PGMN included in the subsequent program loops PL2, PL3 to PLN, respectively, among the N program loops PL1, PL2, PL3 to PLN may each have only one section.

Particularly, in the program operation according to the second embodiment, it may be seen that the length of the program pulse application operation SUPPLY1 of the program operation PGM1 included in the first program loop PL1 is relatively greater than the lengths of the program pulse application operations SUPPLY2, SUPPLY3 to SUPPLYN of the program operations PGM2, PGM3 to PGMN included in the subsequent program loops PL2, PL3 to PLN.

Specifically, the program operation control unit 43 may control the operation of the program and verification circuit 41 to apply a first program pulse PU1 to the program target word line in the first section SEC1 of the program pulse application operation SUPPLY1 of the program operation PGM1 included in the first program loop PL1. The program operation control unit 43 may control the operation of the program and verification circuit 41 to apply a second program pulse PU2 to the program target word line in the second section SEC2 of the program pulse application operation SUPPLY1 of the program operation PGM1 included in the first program loop PL1. According to an embodiment, as illustrated in the drawing, the length of the first section SEC1 of the program pulse application operation SUPPLY1 of the program operation PGM1 included in the first program loop PL1 may be set to be greater than the length of the second section SEC2. According to another embodiment, unlike the drawing, the length of the first section SEC1 and the length of the second section SEC2 of the program pulse application operation SUPPLY1 of the program operation PGM1 included in the first program loop PL1 may be set to be the same.

The program operation control unit 43 may control the operation of the program and verification circuit 41 to apply third program pulses PU3 to the program target word line in the ISPP method in the program operations PGM2, PGM3 to PGMN included in the subsequent program loops PL2, PL3 to PLN, respectively, which are repeated after the first program loop PL1. Voltage levels of the third program pulses PU3 may increase according to the ISPP method as the program loops PL2, PL3 to PLN are repeated as illustrated in the drawing.

The program operation control unit 43 may control the operation of the program and verification circuit 41 to set a voltage level of the first program pulse PU1 to be the same as a voltage level of the second program pulse PU2.

The program operation control unit 43 may control the operation of the program and verification circuit 41 to set the voltage levels of the third program pulses PU3 to be higher than the voltage levels of the first and second program pulses PU1 and PU2.

According to an embodiment, a voltage level of the smallest pulse among the third program pulses PU3 whose voltage levels increase according to the repetition of the program loops PL2, PL3 to PLN may also be set to be higher than the voltage levels of the first and second program pulses PU1 and PU2.

The program operation control unit 43 may control the operation of the program and verification circuit 41 to set voltage levels of the plurality of bit lines BLs to a first type TYPE1 at the start of a bit line setup operation SET UP1 of the program operation PGM1 included in the first program loop PL1 and maintain the voltage levels until the end of the first section SEC1 of the program pulse application operation SUPPLY1 of the program operation PGM1 included in the first program loop PL1. The program operation control unit 43 may control the operation of the program and verification circuit 41 to set the voltage levels of the plurality of bit lines BLs to the first type TYPE1 from a start time point of the bit line setup operation SET UP1 of the program operation PGM1 included in the first program loop PL1 until the end of the first section SEC1 of the program pulse application operation SUPPLY1 of the program operation PGM1.

The program operation control unit 43 may control the operation of the program and verification circuit 41 to reset the voltage levels of the plurality of bit lines BLs to a second type TYPE2 in the second section SEC2 of the program pulse application operation SUPPLY1 of the program operation PGM1 included in the first program loop PL1.

The program operation control unit 43 may control the operation of the program and verification circuit 41 to set the voltage levels of the plurality of bit lines BLs to a third type TYPE3 in bit line setup operations SET UP2, SET UP3 to SET UPN of the program operations PGM2, PGM3 to PGMN included in the subsequent program loops PL2, PL3 to PLN and maintain the voltage levels until the program pulse application operations SUPPLY2, SUPPLY3 to SUPPLYN of the program operations PGM2, PGM3 to PGMN included in the subsequent program loops PL2, PL3 to PLN. The program operation control unit 43 may control the operation of the program and verification circuit 41 to set the voltage levels of the plurality of bit lines BLs to the third type TYPE3 from start time points of the bit line setup operations SET UP2, SET UP3 to SET UPN of the program operations PGM2, PGM3 to PGMN included in the subsequent program loops PL2, PL3 to PLN until the program pulse application operations SUPPLY2, SUPPLY3 to SUPPLYN.

Referring to FIG. 8, it may be seen in what order the program operation according to the second embodiment described with reference to FIGS. 4 and 7 are performed.

When the programming starts, it may be checked whether a current program loop is the first program loop PL1 of the program loops PL1, PL2, PL3 to PLN that are repeatedly performed until programming for the program target word line among the plurality of word lines WLs is completed, in operation S80.

When a check result indicates that the current program loop is the first program loop PL1 (that is, "YES" in operation S80), the length of the program operation PGM1 included in the first program loop PL1 may be set to be greater than the lengths of the program operations PGM2, PGM3 to PGMN included in the subsequent program loops PL2, PL3 to PLN (longer than PGM<2:N>), in operation S89.

In operation S81 subsequent to operation S89, the plurality of bit lines BLs may be set to the first type TYPE1 in the bit line setup operation SET UP1 of the program operation PGM1. The first bit line group of the plurality of bit lines BLs may be set to the first voltage level, and the second bit line group of the plurality of bit lines BLs may be set to the second voltage level lower than the first voltage level.

In operation S82 subsequent to operation S81, the first program pulse PU1 may be applied to the program target word line in the first section SEC1 included in the program pulse application operation SUPPLY1 of the program operation PGM1.

After operation S82, in the second section SEC2 included in the program pulse application operation SUPPLY1 of the program operation PGM1, the operation of setting the plurality of bit lines BLs to the second type TYPE2 in operation S83 and the operation of applying the second program pulse PU2 to the program target word line in operation S84 may be simultaneously performed. In this case, the second program pulse PU2 may have the same voltage level as the first program pulse PU1. That is, while the first program pulse PU1 set in the above-described first embodiment has a relatively high voltage level (HIGH LEVEL, refer to FIG. 6), the first program pulse PU1 set in the second embodiment may have a relatively low voltage level (SMALL LEVEL). Also, the second program pulse PU2 set in the second embodiment may have the same voltage level as the first program pulse PU1 (SAME LEVEL AS PU1).

In operation S87 subsequent to operations S83 and S84, the verification operation VERIFY1 may be performed.

When the check result indicates that the current program loop is not the first program loop PL1 (that is, "NO" in operation S80), that is, the current program loop is the subsequent program loops PL2, PL3 to PLN, the plurality of bit lines BLs may be set to the third type TYPE3 in the bit line setup operations SET UP2, SET UP3 to SET UPN of the program operations PGM2, PGM3 to PGMN, in operation S85. That is, the voltage level of each of the plurality of bit lines BLs may be set according to whether an additional program loop is required as a result of the verification operations VERIFY1, VERIFY2, VERIFY3 to VERIFYN−1.

In operation S86 subsequent to operation S85, the third program pulses PU3 may be applied to the program target word line in the ISPP method in the program pulse application operations SUPPLY2, SUPPLY3 to SUPPLYN of the program operations PGM2, PGM3 to PGMN. In this case, the voltage levels of the third program pulses PU3 may increase according to the ISPP method as the program loops PL2, PL3 to PLN are repeated. Also, the voltage levels of the third program pulses PU3 may be higher than the voltage levels of the first and second program pulses PU1 and PU2 (bigger than PU1&PU2).

In operation S87 subsequent to operation S86, the verification operation VERIFY1 may be performed.

In operation S88 subsequent to operation S87, it may be checked whether the programming is completed.

When the programming is completed (that is, "YES" in operation S88), the programming may terminate.

When the programming is not completed (that is, "NO" in operation S88), the program loops may be repeated.

Figure 9:
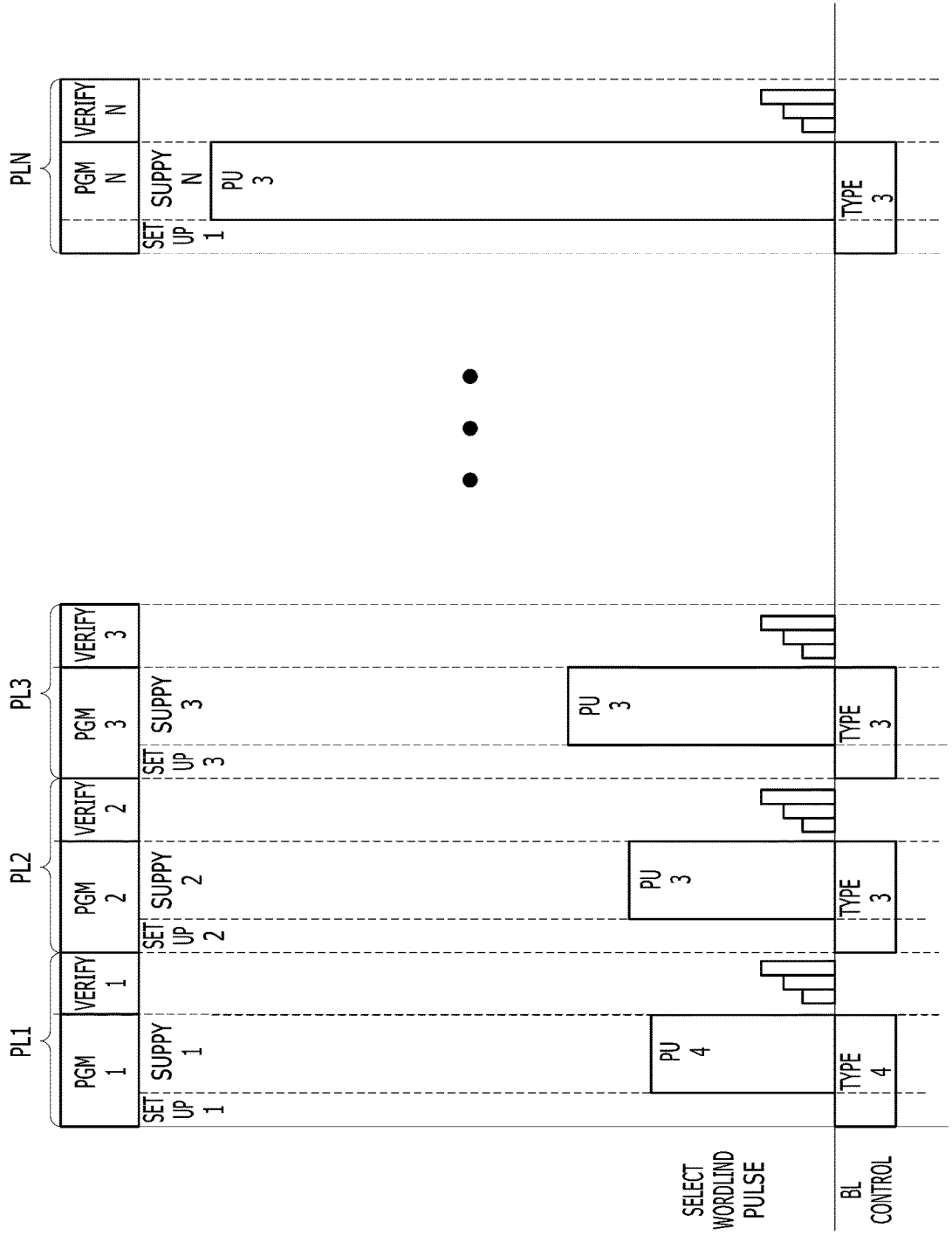
FIGS. 9 and 10 are diagrams illustrating a program operation in accordance with a third embodiment of the present disclosure.
Figure 10:
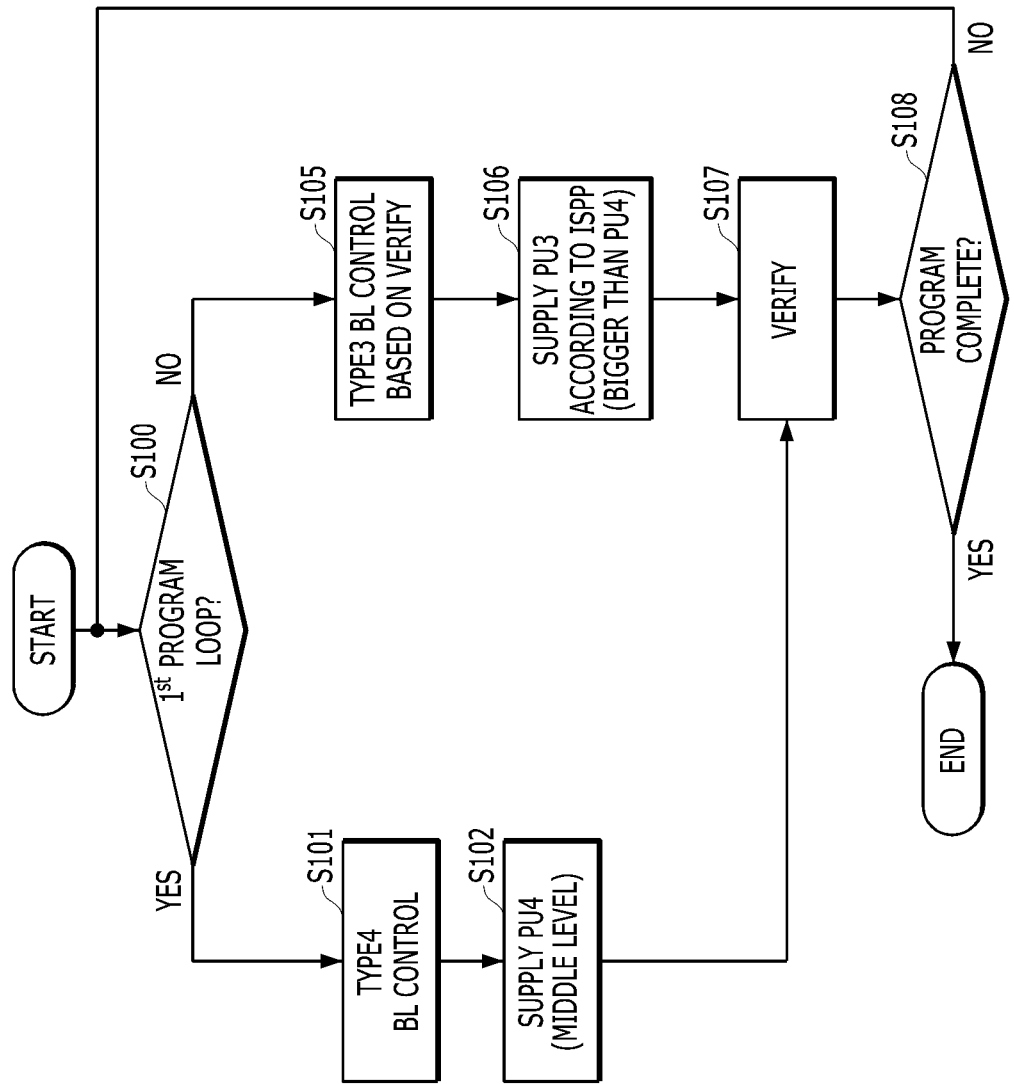

FIGS. 9 and 10 are diagrams illustrating a program operation in accordance with a third embodiment of the present disclosure.

Referring to FIGS. 4 and 9, even in the program operation according to the third embodiment as the program operations described in the first embodiment of FIGS. 5 and 6 and the second embodiment of FIGS. 7 and 8, the first program loop PL1 may be performed in a different way from subsequent program loops PL2, PL3 to PLN among the N program loops PL1, PL2, PL3 to PLN.

In an embodiment, the program pulse application operation SUPPLY1 included in the program operation PGM1 included in the first program loop PL1 among the N program loops PL1, PL2, PL3 to PLN may include only one section. On the other hand, in the third embodiment differently from the first and second embodiments, the program pulse application operation SUPPLY1 included in the program operation PGM1 included in the first program loop PL1 may include only one section, similarly to the program pulse application operations SUPPLY2, SUPPLY3 to SUPPLYN included in the program operations PGM2, PGM3 to PGMN included in the subsequent program loops PL2, PL3 to PLN, respectively.

The difference is that the program operation control unit 43 may control the operation of the program and verification circuit 41 to apply a fourth program pulse PU4 to the program target word line in the program pulse application operation SUPPLY1 included in the program operation PGM1 included in the first program loop PL1. In this case, a voltage level of the fourth program pulse PU4 may be lower than the first program pulse PU1 illustrated in the first embodiment and higher than the second program pulse PU2 illustrated in the first embodiment. The voltage level of the fourth program pulse PU4 may be lower than a third program pulse PU3 applied to the program target word line in the program operations PGM2, PGM3 to PGMN included in the subsequent program loops PL2, PL3 to PLN, respectively, which are repeated after the first program loop PL1.

Another difference is that the program operation control unit 43 may control the operation of the program and verification circuit 41 to set voltage levels of the plurality of bit lines BLs to a fourth type TYPE4 in a bit line setup operation SET UP1 of the program operation PGM1 included in the first program loop PL1 and maintain the voltage levels until the program pulse application operation SUPPLY1 of the program operation PGM1 included in the first program loop PL1. The program operation control unit 43 may control the operation of the program and verification circuit 41 to set the voltage levels of the plurality of bit lines BLs to the fourth type TYPE4 from a start time point of the bit line setup operation SET UP1 of the program operation PGM1 included in the first program loop PL1 until the program pulse application operation SUPPLY1 of the program operation PGM1.

The program operation control unit 43 may control the operation of the program and verification circuit 41 to set the voltage levels of the plurality of bit lines BLs to a third type TYPE3 in bit line setup operations SET UP2, SET UP3 to SET UPN of the program operations PGM2, PGM3 to PGMN included in the subsequent program loops PL2, PL3 to PLN and maintain the voltage levels until the program pulse application operations SUPPLY2, SUPPLY3 to SUPPLYN of the program operations PGM2, PGM3 to PGMN included in the subsequent program loops PL2, PL3 to PLN. The program operation control unit 43 may control the operation of the program and verification circuit 41 to set the voltage levels of the plurality of bit lines BLs to the third type TYPE3 from start time points of the bit line setup operations SET UP2, SET UP3 to SET UPN of the program operations PGM2, PGM3 to PGMN included in the subsequent program loops PL2, PL3 to PLN until the program pulse application operations SUPPLY2, SUPPLY3 to SUPPLYN.

When the bit lines BLs are set to the fourth type TYPE4, the first bit line group of the plurality of bit lines BLs may be set to the first voltage level and the second bit line group may be set to the second voltage level lower than the first voltage level, similarly to the first type TYPE1 described in the first and second embodiments. However, while the first and second embodiments illustrated that the first voltage level is the power source voltage VCORE level in the first type TYPE1, the first voltage level in the fourth type TYPE4 described in the third embodiment may refer to a reference voltage level lower than the power source voltage VCORE level and higher than the ground voltage VSS level. Even in the fourth type TYPE4, the second voltage level may refer to the ground voltage VSS level.

For reference, although the first voltage level in the first type TYPE1 described in the first and second embodiments is the power source voltage VCORE level, the first voltage level may be the reference voltage level lower than the power source voltage VCORE level and higher than the ground voltage VSS level. That is, it may be possible for the first type TYPE1 and the fourth type TYPE4 to be identically set according to the decision of a designer.

Referring to FIG. 10, it may be seen in what order the program operation according to the third embodiment described with reference to FIGS. 4 and 9 are performed.

When the programming starts, it may be checked whether a current program loop is the first program loop PL1 of the program loops PL1, PL2, PL3 to PLN that are repeatedly performed until programming for the program target word line among the plurality of word lines WLs is completed, in operation S100.

When a check result indicates that the current program loop is the first program loop PL1 (that is, "YES" in operation S100), the plurality of bit lines BLs may be set to the fourth type TYPE4 in the bit line setup operation SET UP1 of the program operation PGM1, in operation S101. That is, the first bit line group of the plurality of bit lines BLs may be set to the first voltage level, and the second bit line group may be set to the second voltage level lower than the first voltage level. Particularly, the first bit line group may be set to the reference voltage level lower than the power source voltage VCORE level and higher than the ground voltage VSS level, and the second bit line group may be set to the ground voltage VSS level.

In operation S102 subsequent to operation S101, the fourth program pulse PU4 may be applied to the program target word line in the first section SEC1 included in the program pulse application operation SUPPLY1 of the program operation PGM1. The fourth program pulse PU4 may have a voltage level (MIDDLE LEVEL) lower than the first program pulse PU1 set in the above-described first embodiment and higher than the second program pulse PU2 set in the above-described first embodiment.

In operation S107 subsequent to operation S102, the verification operation VERIFY1 may be performed.

When the check result indicates that the current program loop is not the first program loop PL1 (that is, "NO" in operation S100), that is, the current program loop is the subsequent program loops PL2, PL3 to PLN, the plurality of bit lines BLs may be set to the third type TYPE3 in the bit line setup operations SET UP2, SET UP3 to SET UPN of the program operations PGM2, PGM3 to PGMN, in operation S105. That is, the voltage level of each of the plurality of bit lines BLs may be set according to whether an additional program loop is required as a result of the verification operations VERIFY1, VERIFY2, VERIFY3 to VERIFYN-1.

In operation S106 subsequent to operation S105, the third program pulses PU3 may be applied to the program target word line in the ISPP method in the program pulse application operations SUPPLY2, SUPPLY3 to SUPPLYN of the program operations PGM2, PGM3 to PGMN. In this case, the voltage levels of the third program pulses PU3 may increase according to the ISPP method as the program loops PL2, PL3 to PLN are repeated. Also, the voltage levels of the third program pulses PU3 may be higher than the voltage level of the fourth program pulse PU4 (bigger than PU4).

In operation S107 subsequent to operation S106, the verification operation VERIFY1 may be performed.

In operation S108 subsequent to operation S107, it may be checked whether the programming is completed.

When the programming is completed (that is, "YES" in operation S108), the programming may terminate.

When the programming is not completed (that is, "NO" in operation S108), the program loops may be repeated.

According to embodiments of the present disclosure, a program pulse, which is applied in a first program operation among incremental step pulse program (ISPP) operations, may be divided into two, and bit line setup levels may be set differently on the basis of two divided program pulses. Accordingly, it is possible to improve a program distribution of memory cells when the first program operation is completed.

The effects and advantages obtainable from the present disclosure are not limited to those described herein. Other effects and advantages not described herein will be apparently understood by those skilled in the art, to which the present disclosure pertains, from the above detailed description.

While the present disclosure has been illustrated and described with respect to specific embodiments and drawings, the disclosed embodiments are not intended to be restrictive. Further, it is noted that the present disclosure may be achieved in various ways through substitution, change, and modification, as those skilled in the art will recognize in light of the present disclosure, without departing from the spirit and/or scope of the present disclosure and the following claims.

For example, dispositions and types of the logic gates and transistors described in the aforementioned embodiments may be implemented differently depending on the polarity of an inputted signal. Furthermore, the embodiments may be combined to form additional embodiments.

What is claimed is:

1. A nonvolatile memory device comprising:
a plurality of memory cells coupled between a plurality of word lines and a plurality of bit lines;
a peripheral circuit suitable for performing program loops each including a program operation and a verification operation, the program operation including a setup operation on the plurality of bit lines and an application operation of applying a program pulse to a selected word line and the verification operation including applying a verification voltage to the selected word line; and a control logic circuit suitable for controlling the peripheral circuit to repeatedly perform the program loops until programming for the selected word line is completed, wherein the peripheral circuit performs a first program loop of the program loops by:

applying a first program pulse to the selected word line in a first section of the application operation, applying a second program pulse to the selected word line in a second section of the application operation, setting a first bit line group to a first voltage level and a second bit line group to a second voltage level lower than the first voltage level from a start of the setup operation until an end of the first section of the application operation, and resetting the first bit line group and the second bit line group to the second voltage level in the second section of the application operation.

2. The nonvolatile memory device of claim 1, wherein the second program pulse has a lower level than the first program pulse.

3. The nonvolatile memory device of claim 2, wherein the peripheral circuit performs a program loop subsequent to the first program loop by applying, in the application operation included in the subsequent program loop, a third program pulse having a higher voltage level than the second program pulse.

4. The nonvolatile memory device of claim 3, wherein the third program pulse has a lower voltage level than the first program pulse.

5. The nonvolatile memory device of claim 1,
wherein the first program pulse has the same voltage level as the second program pulse, and
wherein the peripheral circuit repeatedly performs the program loops by performing the application operation longer in the first program loop than in a program loop subsequent to the first program loop.

6. The nonvolatile memory device of claim 5, wherein the peripheral circuit repeatedly performs the program loops further by applying, in the application operation included in the subsequent program loop, a third program pulse having a voltage level equal to or higher than each of the first and second program pulses.

7. The nonvolatile memory device of claim 1, wherein the first voltage level is a power source voltage level, and the second voltage level is a ground voltage level.

8. The nonvolatile memory device of claim 1, wherein the first voltage level is a reference voltage level lower than a power source voltage level and higher than a ground voltage level, and the second voltage level is the ground voltage level.

9. An operating method of a nonvolatile memory device, the operating method comprising:

repeatedly performing, until programming for a selected word line is completed, program loops each including a program operation and a verification operation, the program operation including a setup operation on the plurality of bit lines and an application operation of applying a program pulse to the selected word line and the verification operation including applying a verification voltage to the selected word line, wherein the repeatedly performing includes performing a first program loop of the program loops by:

applying a first program pulse to the selected word line in a first section of the application operation, applying a second program pulse to the selected word line in a second section of the application operation, setting a first bit line group to a first voltage level and a second bit line group to a second voltage level lower than the first voltage level from a start of the setup operation until an end of the first section of the application operation, and resetting the first bit line group and the second bit line group to the second voltage level in the second section of the application operation.

10. The operating method of claim 9, wherein the second program pulse has a lower level than the first program pulse.

11. The operating method of claim 10, wherein the repeatedly performing further includes performing a program loop subsequent to the first program loop by applying, in the application operation included in the subsequent program loop, a third program pulse having a higher voltage level than the second program pulse.

12. The operating method of claim 11, wherein the third program pulse has a lower voltage level than the first program pulse.

13. The operating method of claim 9,
wherein the first program pulse has the same voltage level as the second program pulse, and
wherein the program loops are repeatedly performed by performing the application operation longer in the first program loop than in a program loop subsequent to the first program loop.

14. The operating method of claim 13, wherein the program loops are repeatedly performed further by applying, in the application operation included in the subsequent program loop, a third program pulse having a voltage level equal to or higher than each of the first and second program pulses.

15. The operating method of claim 9, wherein the first voltage level is a power source voltage level, and the second voltage level is a ground voltage level.

16. The operating method of claim 9, wherein the first voltage level is a reference voltage level lower than a power source voltage level and higher than a ground voltage level, and the second voltage level is the ground voltage level.

* * * * *